(12) United States Patent
McClure

(10) Patent No.: US 6,262,617 B1
(45) Date of Patent: Jul. 17, 2001

(54) INTEGRATED CIRCUIT OUTPUT DRIVER

(75) Inventor: David Charles McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 08/367,681

(22) Filed: Dec. 30, 1994

Related U.S. Application Data

(63) Continuation of application No. 07/938,401, filed on Aug. 31, 1992, now abandoned.

(51) Int. Cl.$^7$ ................................................. H03H 11/26
(52) U.S. Cl. .................... 327/270; 327/110; 327/394; 327/565; 327/170
(58) Field of Search ................. 307/303, 303.1, 307/303.2, 594–5, 602–3; 327/594–6, 394, 400, 269, 270, 110, 170

(56) References Cited

U.S. PATENT DOCUMENTS

| | | | |
|---|---|---|---|
| 4,635,234 | 1/1987 | Yamaguchi | 365/233 |
| 5,218,239 * | 6/1993 | Boomer | 307/263 |

FOREIGN PATENT DOCUMENTS

| | | |
|---|---|---|
| 0 431 624 A2 | 6/1992 | (EP) . |
| 61-117785 | 6/1986 | (JP) . |
| 3058624 | 3/1991 | (JP) . |

OTHER PUBLICATIONS

Ichiro Tomioka, et al., "Current Control Buffer for Multi Switching CMOS SOG", 1990 IEEE, Custom Integrated Circuits Conference.

\* cited by examiner

Primary Examiner—Margaret R. Wambach
(74) Attorney, Agent, or Firm—Theodore E. Galanthay; Lisa K. Jorgenson; Dan Venglarik

(57) ABSTRACT

A semiconductor device is provided which has a plurality of output drivers whose slew rates are differentially controlled. The slew rates of the output drivers are controlled by a control means such that the slew rate of at least one of the output drivers is different than the slew rate of another output driver. Preferably, the slew rates are differentially controlled such that an output driver that drives a signal that reaches an output pin of a semiconductor package later slews at a faster rate than an output driver that drives a signal that reaches an output pin of a semiconductor package earlier. In this way all of the output pins of a semiconductor package can be driven to change states at approximately the same time. The slew rates of the output drivers can be differentially controlled through the utilization of programmable resistors.

22 Claims, 4 Drawing Sheets

INTEGRATED CIRCUIT OUTPUT DRIVER

This is a continuation of application Ser. No. 07/938,401, filed Aug. 31, 1992 now abandoned.

BACKGROUND OF THE INVENTION

1. Field of the Invention

The present invention relates generally to semiconductor integrated circuit devices, and more specifically to output driver devices.

2. Description of the Prior Art

As is well known, a phenomenon known as power supply line noise inductance effects can significantly decrease the potential output performance of an integrated circuit device. This phenomena, which results from the inductance on various signal lines both on chip and from chip to package, is proportional to both the inductance and to the rate of change of the current with respect to time (di/dt), and causes the output signal and the power supply lines to oscillate or bounce.

Since the output of the chip is not output until the power supply lines have settled down, the power supply line noise inductance has the effect of slowing down the potential output performance of an integrated circuit device. Many different design techniques have been developed in an attempt to limit di/dt and simultaneously increase the output performance of the chip.

A common approach to this problem is to limit the di/dt for all output drivers. Limiting di/dt both allows the power supply line to stabilize faster and increases the amount of time taken by an output driver to change states. However, with appropriate di/dt limiting, this tradeoff can still result in a decrease in the access time at the output pins of the integrated circuit package, which is an increase in device performance.

Limiting di/dt has been accomplished by several methods. One method is to add resistors to the power supply lines of the output transistors or the stage driving the output transistors. The resistors uniformly reduce the rate of switching of the output drivers. Another method to limit di/dt is to use an output driver designed to drive the load with a constant di/dt. Another approach is to provide power buses for the output drivers which are separate from the rest of the circuit.

It is known that the outputs at the output pins of the integrated circuit package do not all change state at the same time. Since the chip cannot be validly accessed until the slowest output pin is ready, a wait time exists between the time at which the fastest output pin changes state and the time at which the slowest output pin changes state.

Currently available methods for di/dt limiting increase device operating speed by minimizing power supply oscillations, but the methods do not attempt to reduce the wait time. Thus, overall device operating speed is less than the theoretical maximum speed.

It would be desirable to increase device operating speed beyond that currently achievable through the reduction of the power supply oscillation settling time without suffering wait time delays to the extent of the prior art.

SUMMARY OF THE INVENTION

Therefore, according to the present invention a semiconductor device is provided which has a plurality of output drivers whose slew rates are differentially controlled. The slew rates of the output drivers are controlled by a control means such that the slew rate of at least one of the output drivers is different than the slew rate of another output driver. Preferably, the slew rates are differentially controlled such that an output driver that drives a signal that reaches an output pin of a semiconductor package later slews at a faster rate than an output driver that drives a signal that reaches an output pin of a semiconductor package earlier. In this way all of the output pins of a semiconductor package can be driven to change states at approximately the same time. The slew rates of the output drivers can be differentially controlled through the utilization of programmable resistors.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Generally, the purpose of this invention is to increase the operating speed of an integrated circuit device. It is known that operating speed can be increased by implementing circuitry in the output drivers to limit the rate of change of current (di/dt) drawn by the output drivers during state transition. This present invention in its preferred embodiment employs the novel idea of differential di/dt limiting for each output driver.

Differential di/dt limiting is defined as providing di/dt limiting circuitry to the output drivers so that at least one of the output drivers has a different di/dt limit than at least one of the other output drivers. The preferred embodiment of the differential di/dt limiting circuitry is described below.

Figure 1:
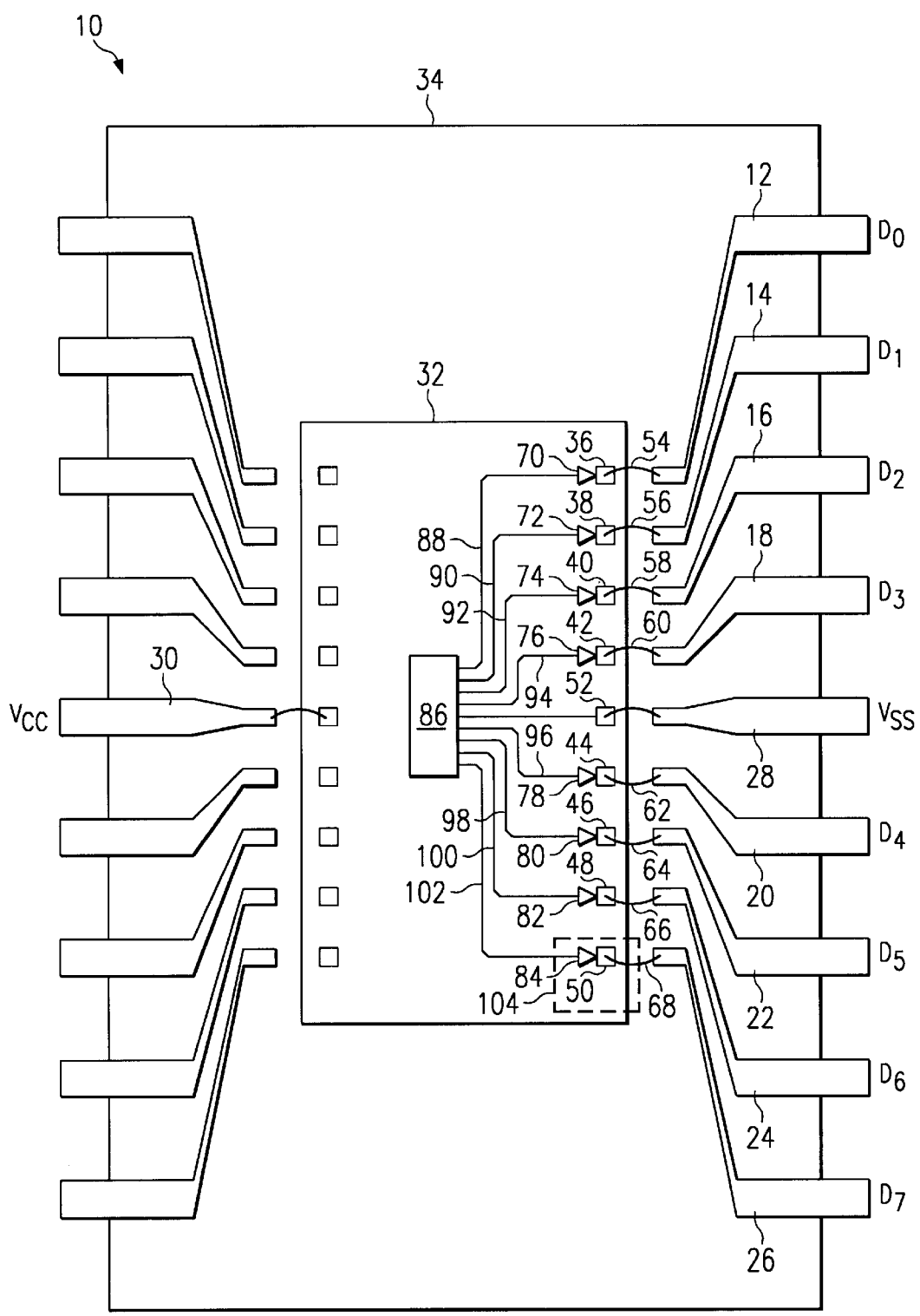
FIG. 1 is a plan view of an integrated circuit package according to the present invention.

FIG. 1 is an illustration of an integrated circuit 10 having 8 output pins, but it will be appreciated by those skilled in the art that other sized integrated circuits may take advantage of the invention described below. The integrated circuit package is accessed by outside means through the output leads 12–26. A low voltage reference is provided through the lead 28 (Vss), and a high voltage reference is provided through the lead 30 (Vcc). An integrated circuit chip 32 is located within the integrated circuit package 34.

The preferred location of the bond pads 36–50 are shown at the outside edge of the integrated circuit chip 32. The output leads 12–26 are connected to the bond pads through bond wires 54–68. The preferred location of the output drivers 70–84 are shown to be adjacent to the bond pads 36–50. The output drivers 70–84 drive the data signals D0–D7 received from the data source 86 so that an acceptable signal is provided to those devices accessing the integrated circuit 10. The data signal is transmitted from the data source 86 to the output drivers 70–84 via the data lines 88–102. Data source 86 represents any circuitry, such as sense amps, which generates data signals for communication off chip.

Figure 2:
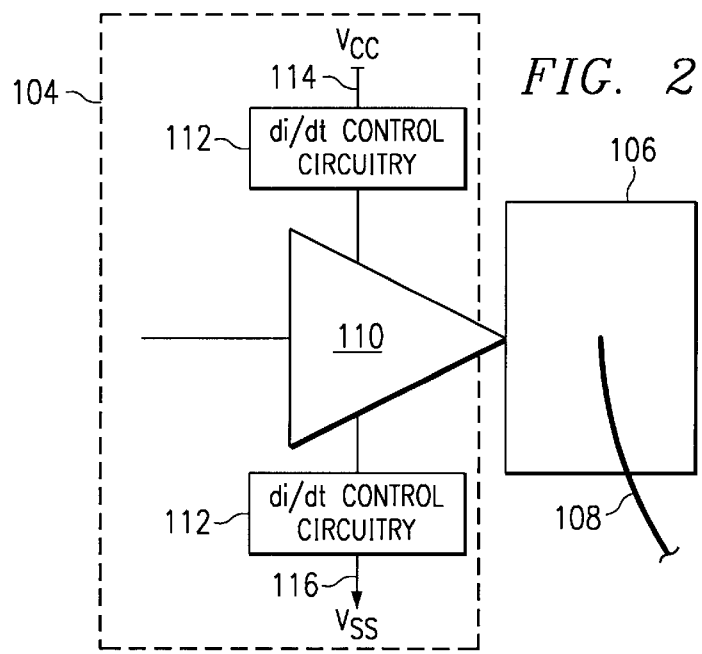
FIG. 2 is an illustration of a single output driver connected to an output pad.

FIG. 2 is a symbolic representation of an individual output driver 104, a bond pad 106 and a bond wire 108 of the integrated circuit 10. The output driver consists of drive circuitry 110 and the differential di/dt control circuitry 112. It will be appreciated by those skilled in the art that the differential di/dt control circuitry may be positioned between the high voltage reference 114 (Vcc) and the drive circuitry 110, between the low voltage reference 116 (Vss) and the drive circuitry 110, between both as shown, or in any other location such that di/dt will be limited to the output driver 110.

Figure 3:
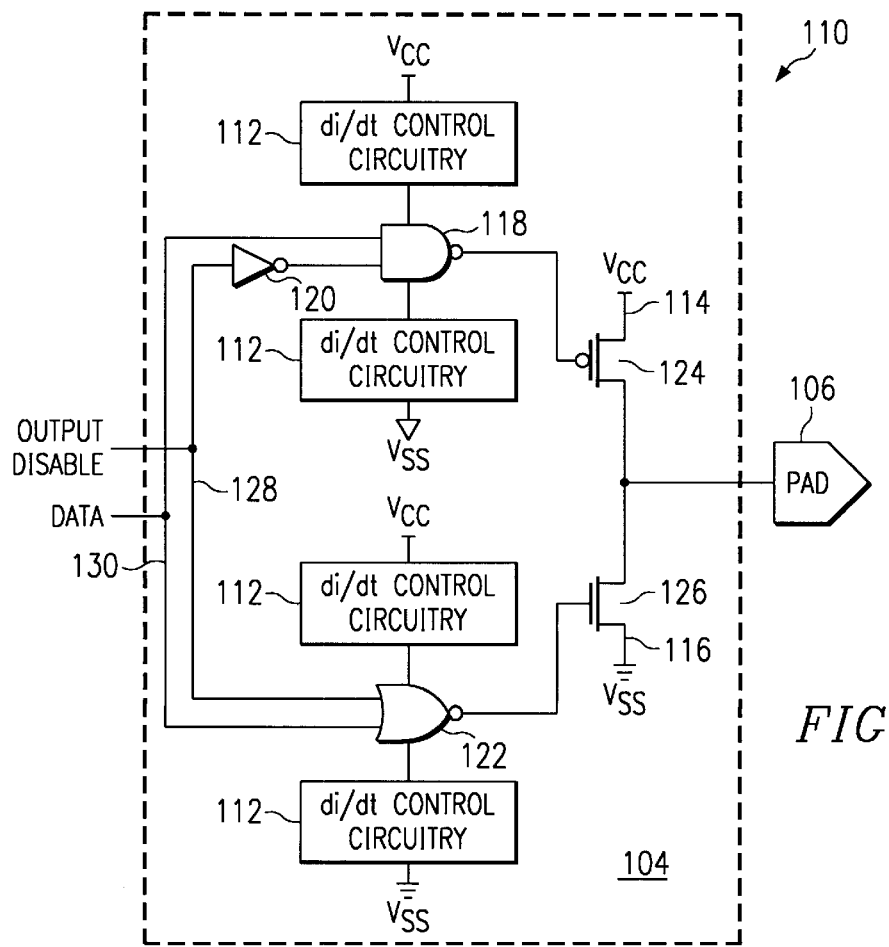
FIG. 3 is a logic diagram of an output driver showing the preferred location of the differential di/dt control circuitry.

FIG. 3 is a symbolic representation of the preferred embodiment of an output driver 104 and a bond pad 106. The output driver consists of drive circuitry 110 and differential di/dt control circuitry 112. The drive circuitry 110 consists of a NAND gate 118, an inverter 120, a NOR gate 122, a p-channel transistor 124, and a n-channel transistor 126. The drive circuitry 110 is connected to a high voltage reference source 114 (Vcc), and a low voltage reference source 116 (Vss). As known in the art, transistor 124 can be an n-channel transistor to improve resistance to latch up effects.

Two signals are received by the output driver 104, the output disable signal 128 and the data signal 130. When the output disable signal 128 is low and the data signal 130 changes from low to high, the p-channel transistor 124 will go from an "off" state to an "on" state. The n-channel transistor 126 will go from an "on" state to an "off" state. The NAND gate 118 and the NOR gate 122 provide the voltage to drive the p-channel transistor 124 and n-channel transistor 126, respectively. Therefore, limiting the slew rate of the NAND gate 118 and the NOR gate 122 limits the rate of change of current through the p-channel transistor 124 and the n-channel transistor 126.

As the p-channel transistor 124 and n-channel transistor 126 change states they begin to draw current along with the rest of the drive circuitry 110. The rate of change of this current is represented by di/dt. To control the rate of change of current, differential di/dt control circuitry is introduced between the power supply and NAND gate 118 and NOR gate 122. The nomenclature of "differential di/dt control circuitry" is used because the di/dt limit will be different for some of the output drivers.

Figure 4:
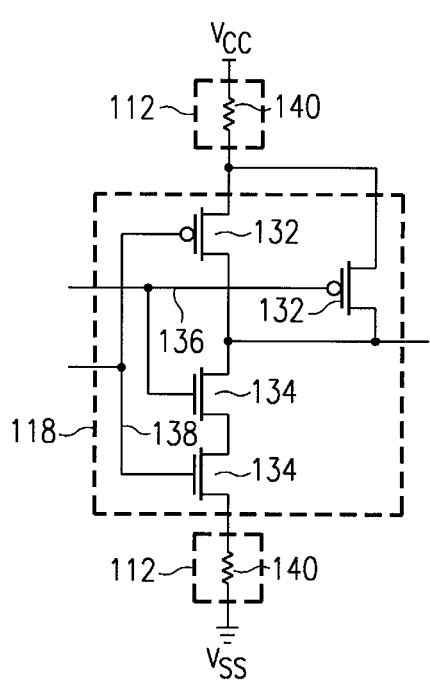
FIG. 4 is a schematic diagram of a NAND gate showing a preferred type of differential di/dt control circuitry.

FIG. 4 represents the preferred embodiment of the NAND gate 118 portion of the drive circuitry 110 and the preferred embodiment of the differential di/dt control circuitry 112. The NAND gate 118 consists of two p-channel transistors 132 connected in parallel and two n-channel transistors 134 connected in series. Each of the input signal lines 136 and 138 is connected to one of the p-channel transistors 132 and one of the n-channel transistors 134. The differential di/dt control circuitry 112 consists of programmable resistors 140. A lower value of resistance is used to provide less current limiting.

Resistor 140 connected to the p-channel devices 132 provides slew rate limiting during a positive-going transition of the NAND gate output, and resistor 140 connected to the n-channel devices 134 provides slew rate limiting during a negative-going transition of the output. The two resistors 140 need not have the same value, and one may in fact not be included depending on the particular design. NOR gate 122 is constructed in a similar manner, and operates analogously.

Figure 5:
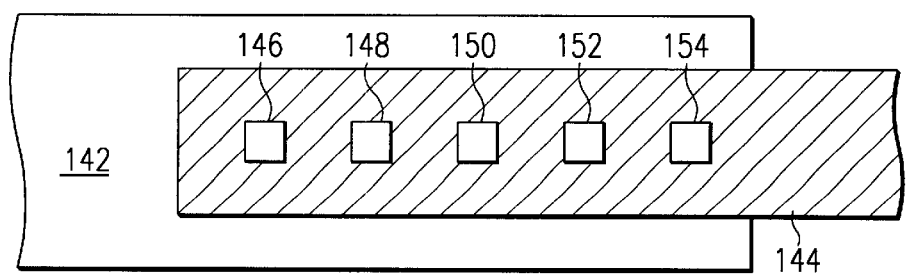
FIG. 5 is a plan view of a selectable resistance load.

FIG. 5 is a preferred embodiment of the current limiting resistor 140. The resistor 140 is a programmable poly resistor, but could be any other type of resistor as known in the art. Different values of resistance can be obtained by connecting the metal interconnect lead portion 142 to the poly resistor 144 at different contact locations 146–154. Making contact at location 146 provides a higher value resistor, while making contact at location 154 provides a lower value resistor. Use of such programmable resistors allows a modular output driver design to be utilized to provide differential di/dt limiting to the various output drivers.

FIGS. 6–9 are timing diagrams of data signals D0–D7 at various points on the integrated circuit 10. The data signals D0–D7 represent data from an 8 bit integrated circuit 10, but it will be appreciated by those skilled in the art that other size integrated circuits will have similar timing diagrams and may take advantage of the invention described below.

Figure 6:
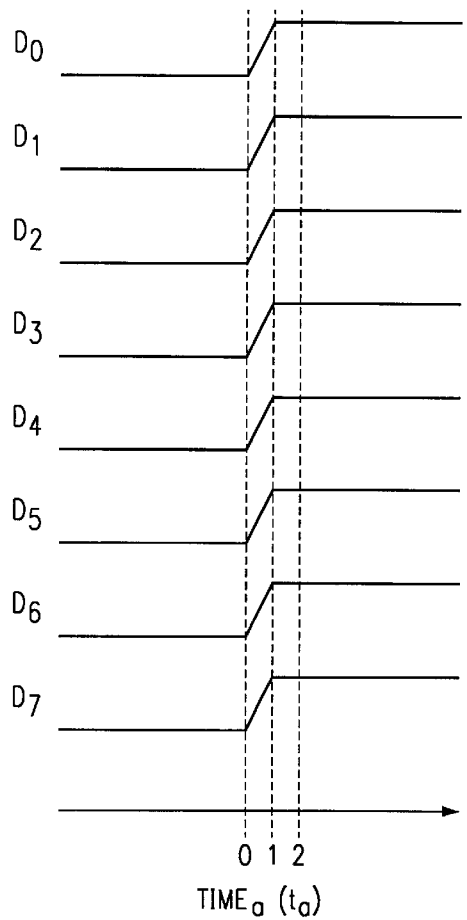
FIGS. 6–9 are timing diagrams illustrating operation of various output driver circuits.

FIG. 6 is a timing diagram representing data signals D0–D7 at the data source 86 output. As described above, data source 86 represents any circuitry, such as sense amps or a register, that generates output signals. The data signals D0–D7 are shown at the data source 86 changing from a low state at $t_a=0$ to a high state at $t_a=1$. It will be appreciated by those skilled in the art that the data signals D0–D7 may not actually change states simultaneously. It will be further appreciated by those skilled in the art that state changes can also be from high to low or any combination thereof.

Figure 7:
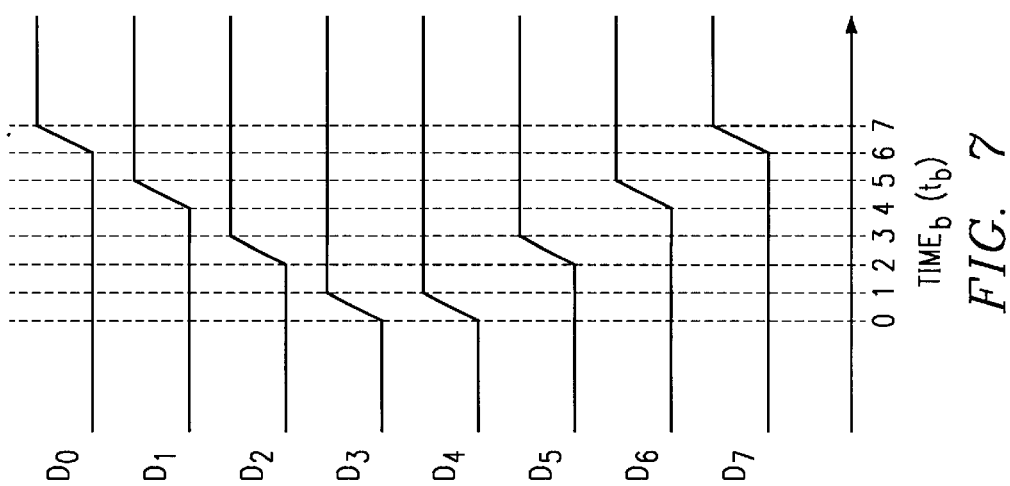

FIG. 7 is a timing diagram representing data signals D0–D7 at the inputs to the output drivers 70–84, respectively. The data signals D0–D7 arrive at the input to the output drivers at various times ranging from $t_b=0$ to $t_b=6$. The time delays are due to differential propagation delay for the data signals D0–D7. The differential propagation delay is caused by various factors including different inductive and capacitive loading and longer data lines 88–102 for some of the data signals D0–D7. Output drivers located further from the data source will generally receive their data later. Also, output drivers further from supply pins may tend to switch slower due to resistance and inductance in the supply lines.

FIG. 7 shows D0 and D7 arriving at the output drivers 70 and 84 at the same time, D1 and D6 arriving at the output drivers 72 and 82 at the same time, D2 and D5 arriving at the output drivers 74 and 80 at the same time, and D3 and D4 arriving at the output drivers 76 and 78 at the same time. Because some of the data signals D0–D7 arrive at an output driver sooner than others, those output drivers will begin to change states sooner than the others. It will be appreciated by those skilled in the art that the data signals D0–D7 may arrive at the inputs of the output drivers at different times than those shown.

An integrated circuit 10 cannot be validly accessed by another device until all of its outputs at the output leads 12–26 have finished changing to their appropriate states. As a result the operating speed of the integrated circuit 10 is measured using the time at which the slowest output changes state. If there is less di/dt limiting for those output leads that change state slower than others, the slew rate of the slower outputs will increase. The time difference between when the fastest output lead changes state and when the slowest output lead changes state is therefore decreased or eliminated.

Less di/dt limiting also tends to cause greater power supply oscillation or bounce. The power supply oscillations cause the signals D0–D7 at the output leads 12–26, respectively, to oscillate. However, with differential di/dt limiting, the time saved by forcing the slower output leads to change states more quickly is greater than the increase in the time necessary for the output leads to stabilize. The result is a net increase in the integrated circuit 10 operating speed.

Figure 8:
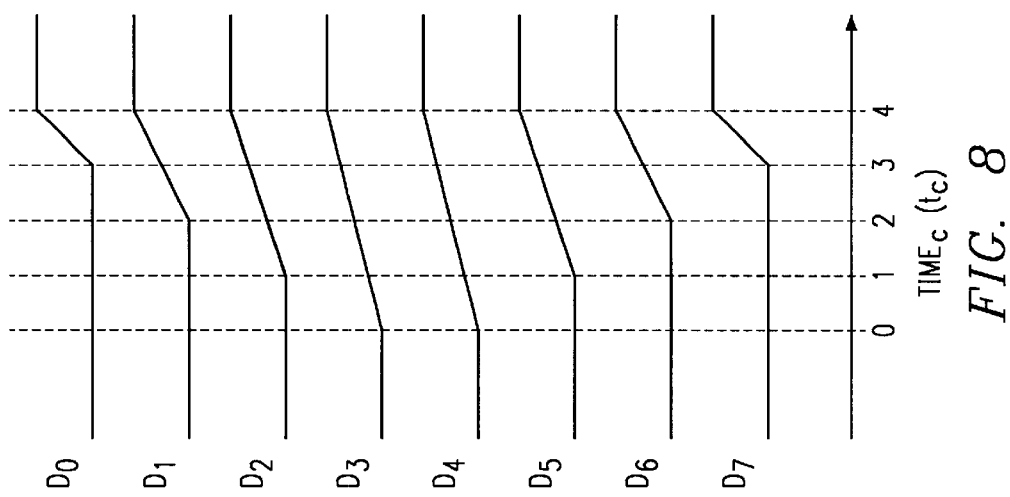

FIG. 8 is a timing diagram representing data signals D0–D7 at the output leads 12–26, respectively, of the integrated circuit 10 with the implementation of differential di/dt limiting circuitry 112. The state at the output leads of the integrated circuit 10 receiving those data signals D0–D7 that arrived at the input of an output driver sooner than others as illustrated in FIG. 7 will begin to change state sooner than the others. As shown in FIG. 8, output leads 18 and 20 receiving data signals D3 and D4 begin to change state at $t_c=0$, output leads 16 and 22 receiving data signals D2 and D5 begin to change state at $t_c=1$ output leads 14 and 24 receiving data signals D1 and D6 begin to change state at $t_c=2$, and output leads 12 and 26 receiving data signals D0 and D7 begin to change state at $t_c=3$.

As described above, the preferred differential di/dt control circuitry consists of a programmable poly resistor 140. To provide less di/dt limiting, the programmable poly resistor 140 should be programmed for a smaller resistance. In the illustrated embodiment, the differential di/dt limiting circuitry 112 is applied so that di/dt is greater for output drivers 70 and 84 than for output drivers 72 and 82, di/dt is greater for output drivers 72 and 82 than for output drivers 74 and 80, and di/dt is greater for output drivers 74 and 80 than for output drivers 76 and 78.

The larger di/dt is allowed to be, the faster an output lead will change state. As a result, the output leads 12 and 26 receiving signals D0 and D7, respectively, change states in delta $t_c=1$, the output leads 14 and 24 receiving signals D1 and D6 change states in delta $t_c=2$, the output leads 16 and 22 receiving signals D2 and D5 change states in delta $t_c=3$, and the output leads 18 and 20 receiving signals D3 and D4 change states in delta $t_c=4$. The result is that all output leads 12–26 reach their final state simultaneously.

It will be appreciated by those skilled in the art that the above example is for illustrative purposes, and implementations will vary widely depending upon the particular characteristics of any particular device. For example, only one or two output drivers may need a faster di/dt limit in order to improve overall device operation. The particular levels of slew rate limiting programmed into the various output drivers will be a tradeoff between improving the output speed of the slower drivers, while keeping di/dt limiting low enough to minimize power supply bounce.

Figure 9:
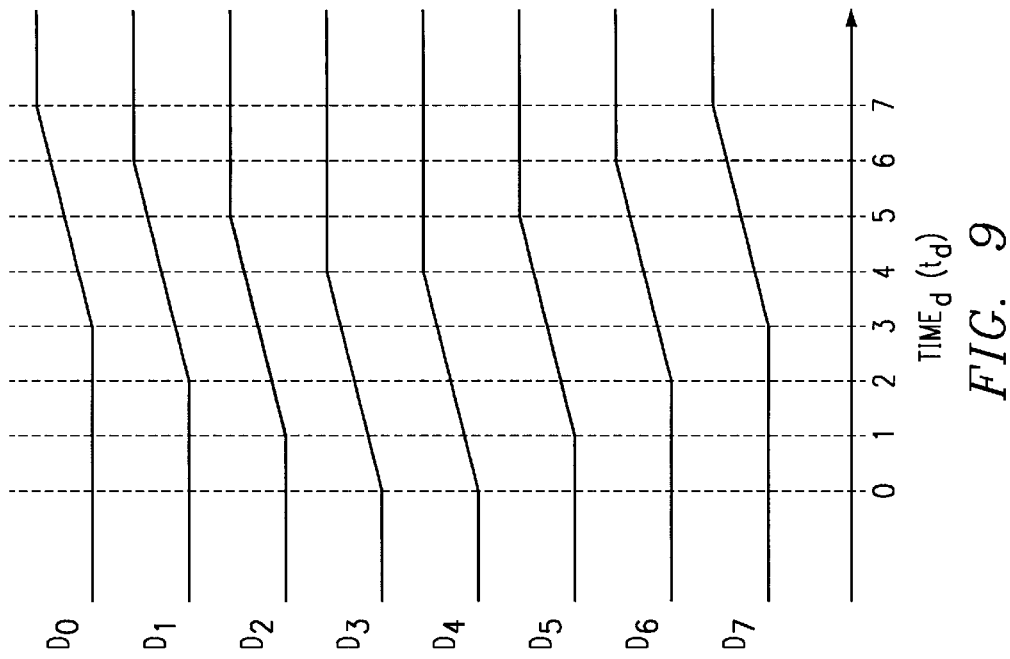

FIG. 9 is a timing diagram representing data signals D0–D7 at the output leads 12–26, respectively, of the integrated circuit 10 without the implementation of differential di/dt limiting. For this illustration, consistent with prior art practices, the slew rate of all output drivers is the same. The state at the output leads of the integrated circuit 10 receiving those data signals D0–D7 that arrived at the input an output driver 70–84 sooner than others, as illustrated in FIG. 7, will begin to change sooner than the others. As shown in FIG. 9, output leads 18 and 20 receiving data signals D3 and D4 begin to change state at $t_d=0$, output leads 16 and 22 receiving data signals D2 and D5 begin to change state at $t_d=1$, output leads 14 and 24 receiving data signals D1 and D6 begin to change state at $t_d=2$, and output leads 12 and 26 receiving data signals D0 and D7 begin to change state at $t_d=3$.

Without differential di/dt limiting, the output leads that begin changing state before other output leads will also finish changing state before those other output leads. Because di/dt is not differentially controlled, the output leads 12–26 all change states at delta $t_d=4$ resulting in the different output leads changing state at different times. The time difference between when the fastest output leads 18 and 20 receiving data signals D3 and D4 change state and when the slowest output leads 12 and 26 receiving data signals D0 and D7 is delta $t_d=3$.

Thus, providing differential di/dt limiting for the output drivers of a device can improve its overall performance. Providing less limiting on otherwise slow output drivers can reduce the delay before all outputs are valid, without unduly increasing the adverse effects of power supply bounce. This is especially true when only a small number of output drivers need reduced di/dt limiting. The slew rates of the various output drivers can be adjusted to optimize output speed with supply bounce minimization.

While the invention has been particularly shown and described with reference to a preferred embodiment, it will be understood by those skilled in the art that various changes in form and detail may be made therein without departing from the spirit and scope of the invention.

What is claimed is:

1. A semiconductor device, comprising:
    a plurality of bond pads for connecting signals off of the device; and
    a plurality of output drivers each proximate to a corresponding bond pad and receiving a data signal from a data source, wherein each of the output drivers contains a corresponding control means for controlling a slew rate of the respective output driver such that the slew rate of an output driver for a first bond pad further from a data source than all remaining bond pads is faster than a slew rate of an output driver for a second bond pad closer to the data source than the first bond pad.

2. The semiconductor device of claim 1, wherein a slew rate for each of the plurality of output drivers is controlled to offset a delay in receiving a data signal from the data source so that signals at the bond pads change state at substantially the same time.

3. The semiconductor device of claim 2, wherein each of the plurality of output drivers includes a programmable resistor controlling the amount of current used by the corresponding output driver in changing states.

4. An integrated circuit, comprising:
    a data source generating a plurality of data signals;
    a plurality of bond pads for transmitting signals off of the integrated circuit;
    a plurality of output drivers each proximate to a corresponding bond pad and receiving a data signal from the data source; and
    signal lines transmitting each data signal to an output driver, each signal line adding a transmission delay to a corresponding data signal, wherein a first signal line transmitting the first data signal includes a first transmission delay different than a second transmission delay for a second signal line transmitting a second data signal,
    wherein a slew rate for a first output driver receiving the first data signal is controlled differently than a slew rate for a second output driver receiving the second data signal to offset the difference between the first and second transmission delays.

5. The integrated circuit of claim 4, wherein the first transmission delay is less than the second transmission delay, and wherein the slew rate for the first output driver is controlled to be slower than a slew rate for the second output driver.

6. The integrated circuit of claim 4, wherein each of the plurality of output drivers further comprises:
- first and second output transistors connected in series between upper and lower power supply voltages; and
- at least one programmable resistor controlling current employing in changing a signal switching the first and second output transistors.

7. The integrated circuit of claim 6, wherein the at least one programmable resistor further comprises:
- a poly resistor; and
- a conductive lead overlapping a portion of the poly resistor, wherein the resistive value of the poly resistor is selected by selecting a location for a contact between the poly resistor and the conductive lead.

8. The integrated circuit of claim 7, wherein the location for the contact between the poly resistor and the conductive lead within the at least one programmable resistor in each output driver is selected based on a distance of the respective output driver from the data source.

9. The integrated circuit of claim 8, wherein the location for the contact between the poly resistor and the conductive lead within the at least one programmable resistor in the first output driver is selected to provide a larger resistive value than the location for the contact between the poly resistor and the conductive lead within the at least one programmable resistor in the first output driver when the first input driver is closer to the data source than the second input driver.

10. The integrated circuit of claim 6, wherein each of the plurality of output drivers further comprises:
- a NAND gate controlling switching of the first output transistor, a first programmable resistor controlling current utilized by the NAND gate; and
- a NOR gate controlling switching of the second output transistor, a second programmable resistor controlling current utilized by the NOR gate.

11. The integrated circuit of claim 6, wherein the first and second output transistors further comprise:
- a p-channel transistor connected between the upper power supply voltage and an output of the respective output driver; and
- an n-channel transistor connected between the output of the respective output driver and the lower power supply voltage.

12. The integrated circuit of claim 4, wherein a first bond pad proximate to the first output driver is further from the data source than a second bond pad proximate to the second output driver, and wherein a slew rate in the first output driver is faster than a slew rate in the second output driver.

13. The integrated circuit of claim 4, wherein a first bond pad proximate to the first output driver is closer to the data source than a second bond pad proximate to the second output driver, and wherein a slew rate in the first output driver is slower than a slew rate in the second output driver.

14. The integrated circuit of claim 13, wherein a third bond pad within the plurality of bond pads proximate to a third output driver within the plurality of output drivers is located further from the data source than the first bond pad and closer to the data source than the second bond pad, and wherein a slew rate in the third output driver is faster than the slew rate in the first output driver and slower than the slew rate in the second output driver.

15. An output driver, comprising:
- first and second output transistors connected in series between upper and lower power supply voltages;
- a switching control circuit controlling switching of the first and second output transistors; and
- at least one programmable resistor controlling slew rate within the output driver by controlling current employed by the switching control circuit, wherein the slew rate is set based on a distance of the output driver from a data source.

16. The output driver of claim 15, wherein the switching control circuit further comprises:
- a NAND gate controlling switching of the first output transistor; and
- a NOR gate controlling switching of the second output transistor.

17. The output driver of claim 16, wherein the at least one programmable resistor further comprises:
- a first programmable resistor controlling current utilized by the NAND gate; and
- a second programmable resistor controlling current utilized by the NOR gate.

18. The output driver of claim 15, wherein the at least one programmable resistor further comprises:
- a poly resistor; and
- a conductive lead overlapping a portion of the poly resistor, wherein the resistive value of the poly resistor is selected by selecting a location for a contact between the poly resistor and the conductive lead.

19. The output driver of claim 15, wherein the at least one programmable resistor further comprises:
- a single resistor having a selectable resistive value.

20. The output driver of claim 15, wherein each programmable resistor within the output driver further comprises:
- a single resistor having a selectable resistive value.

21. The output driver of claim 15, wherein the slew rate within the output driver is set to offset a data signal transmission delay from the data source to the output driver.

22. The output driver of claim 15, wherein the slew rate within the output driver is selected to be faster if the output driver is farther from the data source than an other output driver and is selected to be slower if the output driver is closer to the data source than the other output driver.

* * * * *